(12) United States Patent
Sonoyama et al.

(10) Patent No.: US 8,023,391 B2
(45) Date of Patent: Sep. 20, 2011

(54) PHOTODETECTION DEVICE AND OPTICAL DISK DEVICE

(75) Inventors: Takashi Sonoyama, Tokyo (JP); Keiji Narusawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 576 days.

(21) Appl. No.: 12/025,970

(22) Filed: Feb. 5, 2008

(65) Prior Publication Data

US 2008/0253260 A1    Oct. 16, 2008

(30) Foreign Application Priority Data

Feb. 7, 2007    (JP) .................................. 2007-027676

(51) Int. Cl.
  *G11B 7/00*    (2006.01)
(52) U.S. Cl. ..................... 369/116; 369/124.15; 369/120
(58) Field of Classification Search .......................... None
  See application file for complete search history.

(56) References Cited

U.S. PATENT DOCUMENTS 5,798,992 A * 8/1998 Kaneko et al. ............. 369/53.26
2004/0202072 A1 10/2004 Rees et al.

FOREIGN PATENT DOCUMENTS

| JP | 03-244206 | 10/1991 |
|---|---|---|
| JP | 07-073496 | 3/1995 |
| JP | 11-328692 | 11/1999 |
| JP | 2000-182241 | 6/2000 |
| JP | 2000-339603 | 12/2000 |
| JP | 2004-281922 | 10/2004 |
| JP | 2005-004847 | 1/2005 |
| JP | 2006-520063 | 8/2006 |

OTHER PUBLICATIONS

A Japanese Office Action dated Jan. 6, 2009, issued in connection with counterpart Japanese Patent Application No. 2007-027676.
Japanese Patent Office Action corresponding to Japanese Serial No. P2007-027676 dated Jul. 14, 2009.
Japanese Office Action issued on Apr. 26, 2011 in connection with counterpart JP Application No. 2007-027676.

* cited by examiner

*Primary Examiner* — Joseph Haley
(74) *Attorney, Agent, or Firm* — SNR Denton US LLP

(57) ABSTRACT

A photodetection device is provided with a photoelectric converter portion that converts light to electric current, an electrical current/voltage converter portion, including a feedback circuit that returns at least part of the output to the input side, that converts the electrical current received from the photoelectric converter portion to a voltage corresponding to the resistance value of the feedback circuit and outputs the voltage, where the feedback circuit includes a first MOS transistor that allows the resistance value to be varied in accordance with the gate voltage.

3 Claims, 6 Drawing Sheets

Related Art FIG.7
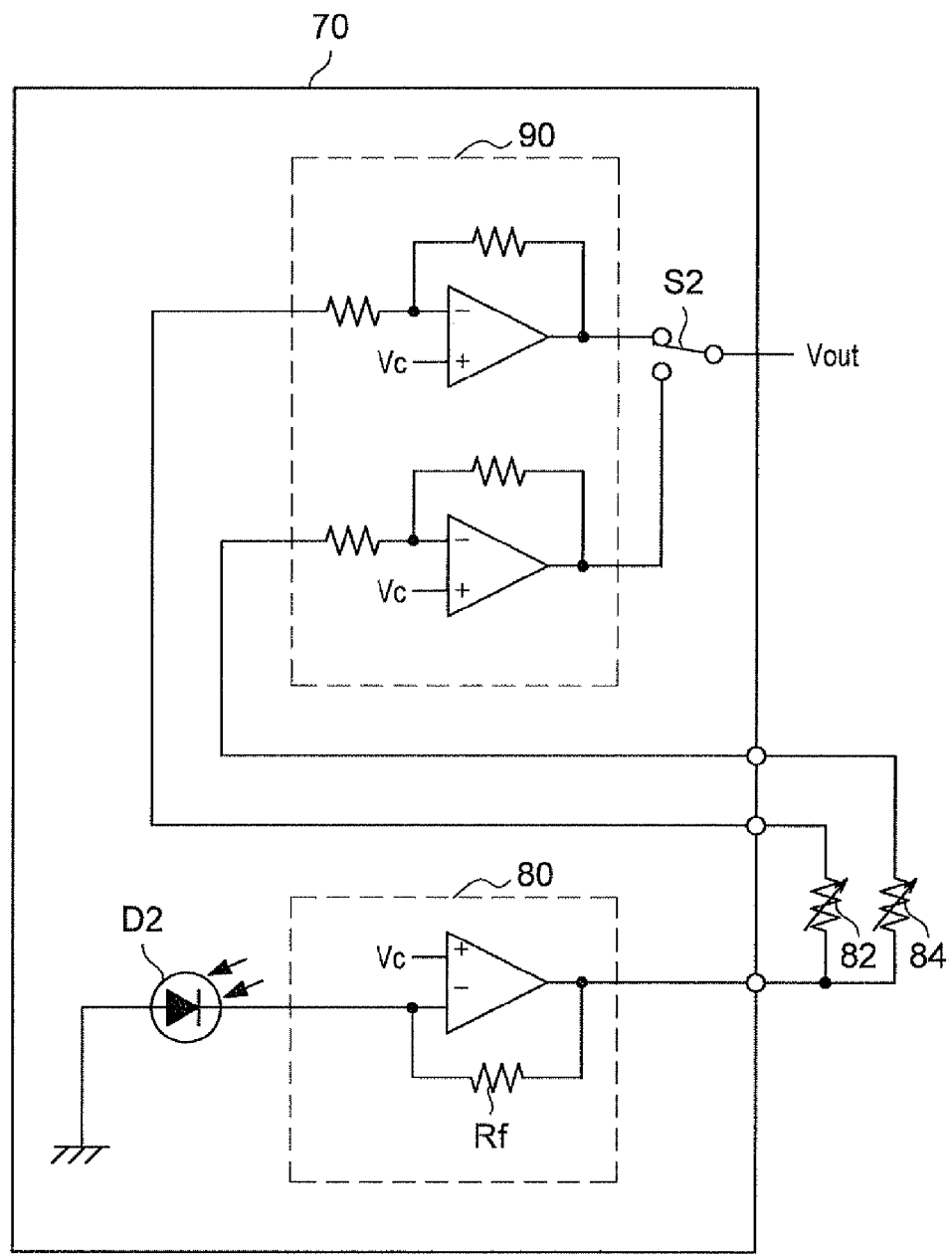

PHOTODETECTION DEVICE AND OPTICAL DISK DEVICE

CROSS REFERENCES TO RELATED APPLICATION(S)

The present invention contains subject matter related to Japanese Patent Application JP 2007-027676 filed in the Japan Patent Office on Feb. 7, 2007, the entire contents of which being incorporated herein by reference.

BACKGROUND OF THE INVENTION

1. Field of the Invention

The present invention relates to a photodetection device that converts light to electrical signals and an optical disk device.

2. Description of the Related Art

In recent years, there has been a rapid spread in optical disks that store selected data, such as images or sound, in digital format, and in optical disk devices that store data on and read data from optical disks. Optical disk devices can store data by irradiating optical disks with laser light, and can read data using the light reflected back when laser light is irradiated onto optical disks.

An optical disk device that includes a front monitor that detects irradiated laser light and converts it into electrical signals is disclosed in, for example, International Publication NO. WO2004/081921. The optical disc device controls the strength of the laser light based on the electrical signals converted from the laser light by the front monitor As mentioned above, laser light plays a pivotal role in optical disk devices, and it is therefore desirable for the front monitor to convert the laser light into electrical signals with a high degree of accuracy.

An example of this type of front monitor structure is shown in FIG. 7. In the example shown in FIG. 7, a front monitor 70 includes a photodiode D2 that converts the laser light irradiated onto the optical disk into an electrical current, a converter portion 80 that converts the electrical current converted by the photodiode D2 into a voltage, an amplifier portion 90 that includes an amplifier that amplifies the voltage converted by the converter portion 80 and adjusted by variable resistors 82 and 84, and a switch S2 that can be used to select the output from the amplifier portion 90.

As the variable resistors 82 and 84 cannot be incorporated into the front monitor 70 IC chip, they are provided externally to the front monitor 70. The manufacturer adjusts the resistance value of the variable resistors 82 and 84 to adjust the amount of variation in the voltage (for example, the degree of voltage rise) on the variable resistors 82 and 84, thus allowing the front monitor gain to be set to the desired value. Note that the voltage is converted from laser light by the converter portion 80. Two variable resistors and amplifiers are provided in order to ensure compatibility with various types of optical disk having different laser wavelengths, such as compact disks (CDs) and Digital Versatile Disks (DVDs).

SUMMARY OF THE INVENTION

However, known optical disk devices, such as the front monitor 70, require a circuit connection with the externally provided variable resistors 82 and 84. Therefore, when an electrical signal is input or output between the variable resistors 82 and 84, the front monitor 70 may experience deterioration in frequency characteristics and pulse response characteristics due to parasitic capacitance and parasitic impedance in the circuit.

The present invention provides a new and improved photodetection device that allows excellent electrical characteristics to be ensured, and an optical disk device that includes the photodetection device.

According to an embodiment of the present invention, there is provided a photodetection device that includes a photoelectric converter portion that converts the irradiated light into an electrical current and an electrical current/voltage conversion portion that includes a feedback circuit that returns at least part of an output to an input side. The electrical current/voltage conversion portion converts the electrical current input from the photoelectric converter portion to a voltage that corresponds with a resistance value in the feedback circuit and outputs the voltage, where the feedback circuit includes a first MOS transistor with a variable resistance value that corresponds with the gate voltage.

The resistance in the electrical current/voltage converter portion feedback circuit contributes to gain in the electrical current/voltage converter portion and the photodetection device. Also, the first MOS transistor on-resistance can be set variably to correspond with the first MOS transistor gate voltage. Therefore, with the above-described structure that provides a feedback circuit in the electrical current/voltage converter portion, the first MOS transistor can be used as a gain adjuster portion to adjust the gain in the electrical current/voltage converter portion and in the photodetection device. Variable resistors to adjust the photodetection device gain are therefore no longer required, allowing reductions in production costs. Further, as the photodetection device gain adjuster portion can be incorporated into the photodetection device, parasitic capacitance and parasitic impedance, which have an effect on output, can be minimized, thus improving the electrical characteristics of the photodetection device, such as frequency characteristics and pulse response characteristics.

The above-described photodetection device may also include a control portion that generates a control signal to control the first MOS transistor gate voltage and a voltage generating portion that generates voltage based on the control signal generated by the control portion and feeds the generated voltage to the first MOS transistor gate. If this structure is adopted, the control portion can control the voltage generated and supplied to the first MOS transistor gate by the voltage generating portion. As a result, the voltage generating portion can supply or apply the voltage to the first MOS transistor gate to achieve the desired first MOS transistor on-resistance.

The above-described voltage generating portion may also include a reference resistor that generates a voltage corresponding to the current supplied by the variable-current source, a second MOS transistor of which the first terminal is connected to a fixed current and of which the second terminal is connected to the reference resistance. The voltage generating portion may also include a gate voltage generating portion that generates the second MOS transistor gate voltage such that the voltage occurring between the second MOS transistor first and second terminals is the same as the voltage occurring in the reference resistance. In the above structure, the second MOS transistor gate voltage generated by the gate voltage generating portion is applied to the first MOS transistor gate.

The feedback circuit may also include resistive elements that contribute to the gain of the electrical current/voltage converter portion. With the present structure, the voltage occurring in the feedback circuit is distributed over the first MOS transistor and the resistive elements. Here, the first MOS transistor on-resistance can only be regarded as equivalent to the resistive elements when the voltage occurring in the first MOS transistor is at a certain voltage level or under. Therefore, by providing the resistive elements in the feedback circuit and suppressing the voltage in the first MOS transistor, the first MOS transistor on-resistance can be regarded as equivalent to the resistive elements.

According to another embodiment of the present invention, there is provided an optical disk device that includes a laser irradiating portion that irradiates the optical disk, a photodetection portion that detects at least part of the laser light irradiated by the laser irradiating portion as electrical signals, and a laser power control portion that, based on the laser light detected as electrical signals by the photodetection portion, controls the strength of the laser light emitted by the laser irradiating portion. The photodetection portion of the optical disk device includes a photoelectric converter portion that converts at least part of the laser light irradiated by the laser irradiating portion to an electrical current, and an electrical current/voltage conversion portion. The electrical current/voltage conversion portion includes a feedback circuit that returns at least part of an output to an input side, and converts the electrical current input from the photoelectric converter portion to a voltage that corresponds with a resistance value in the feedback circuit and outputs the voltage. The feedback circuit includes a first MOS transistor with a variable resistance value that corresponds with the gate voltage.

According to the embodiments of the present invention described above, excellent electrical characteristics can be obtained when converting light into electrical signals.

BRIEF DESCRIPTION OF THE DRAWING(S)

FIG. 7 is an explanatory diagram showing a comparative example of the structure of a front monitor.

DETAILED DESCRIPTION OF THE PREFERRED EMBODIMENT(S)

Figure 1:
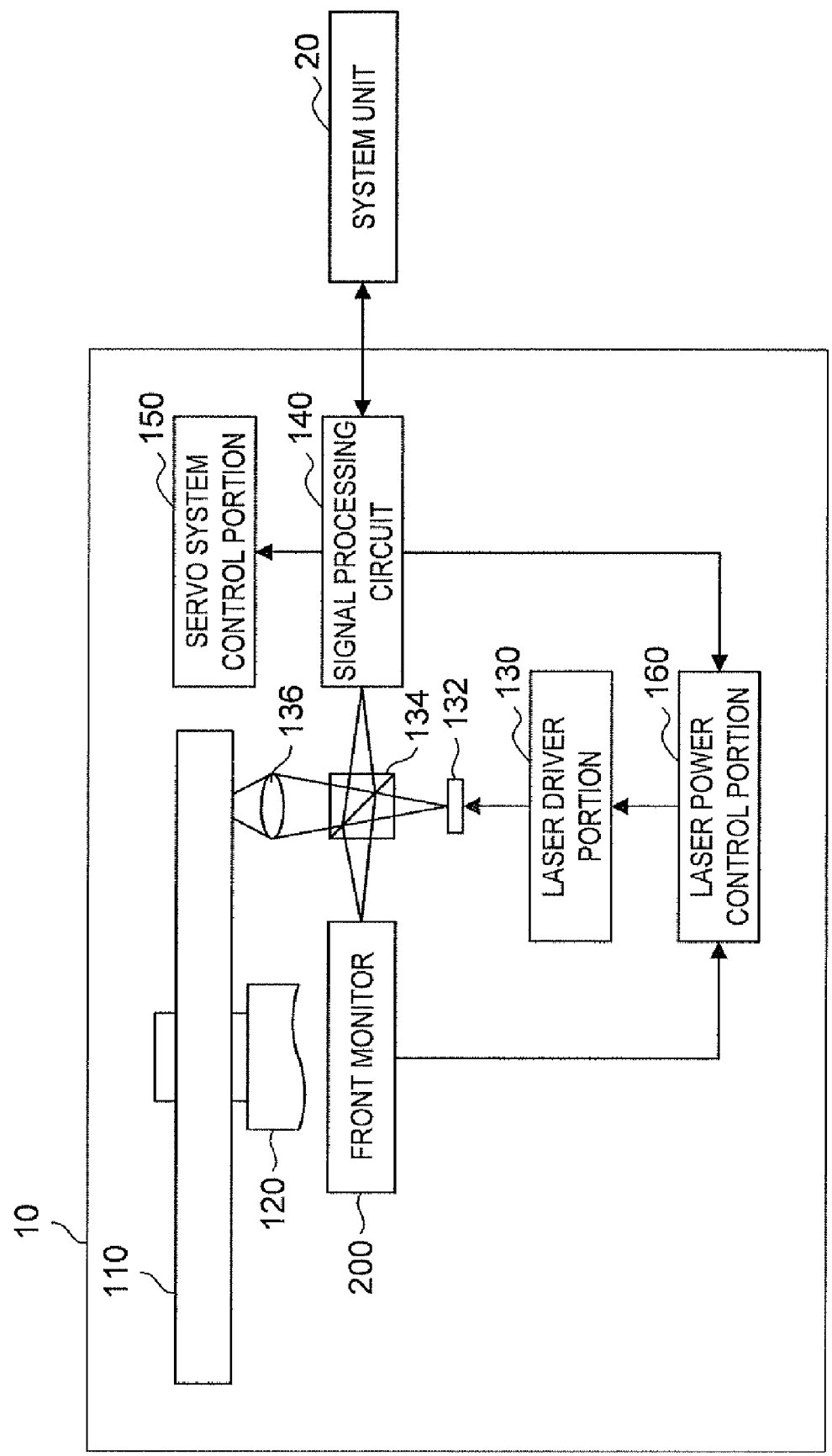
FIG. 1 is an explanatory diagram showing the structure of an optical disk device according to a first embodiment.

Hereinafter, preferred embodiments of the present invention will be described in detail with reference to the appended drawings. Note that, in this specification and the appended drawings, structural elements that have substantially the same function and structure are denoted with the same reference numerals, and repeated explanation of these structural elements is omitted.

First, a structure of an optical disk device 10 according to a first embodiment of the present invention will be explained with reference to FIG. 1. Then, a front monitor 200 that functions as the photodetection device forming the optical disk device 10 will be explained with reference to FIG. 2 to FIG. 5. Next, electrical characteristics of the front monitor 200 according to the first embodiment of the present invention will be explained with reference to FIG. 6.

FIG. 1 is an explanatory diagram showing the structure of an optical disk device 10 according to the present embodiment. The optical disk device 10 includes a spindle motor 120, a laser driver portion 130, a laser aperture 132, a beam splitter 134, an object lens 136, a signal processing circuit 140, a servo system control portion 150, a laser power control portion 160, and a front monitor 200. FIG. 1 shows the optical disk device 10 with an optical disk 110 inserted.

The spindle motor 120 revolves in accordance with rotation control signals from a motor drive circuit (not shown), and functions as the optical disk 110 driver. The optical disk 110 may be, for example, a compact disc recordable (CD-R), a compact disc rewritable (CD-RW), a digital versatile disc recordable (DVD-R), a digital versatile disc rewritable (DVD-RW), a dual-layer digital versatile disc recordable (DVD+R), a dual-layer digital versatile disc rewritable (DVD+RW), a digital versatile disc random access memory (DVD-RAM), a Blue-ray™ disc recordable (BD-R), a dual-layer Blue-ray™ disc recordable (BD-RE), or the like.

The laser driver portion 130 drives the laser aperture 132 in accordance with laser control signals input from the laser power control portion 160. The laser aperture 132 irradiates laser light. The laser driver portion 130 and the laser aperture 132 function as the laser irradiating portion.

The laser light irradiated through the laser aperture 132 passes through or is reflected by the beam splitter 134. For example, the beam splitter 134 allows some of the laser light irradiated through the laser aperture 132 to pass through to the optical disk 110, and reflects some of the laser light irradiated through the laser aperture 132 to the front monitor 200. The objective lens 136 is an optical element to focus the laser light that has passed through the beam splitter 134 onto the recording surface of the optical disk 110.

Using the laser light reflected from the optical disk 110, the signal processing circuit 140 reads any information stored on the optical disk 110. Information stored on the optical disk 110 may include, for example, servo information stored in order to control the optical disk 110 rotation or the laser light irradiation position or the like, music data such as music, lectures, radio programs or the like, image data such as movies, television programs, video programs, photographs, documents, paintings, diagrams or the like, or any other data information such as games or software or the like. The signal processing circuit 140 outputs the above-mentioned servo information to the servo system control portion 150 and outputs the above-mentioned data information to a system unit 20 or an external device including hardware, such as a CPU or RAM or the like. The signal processing circuit 140 receives data signals from the system unit to be stored onto the optical disk 110, converts the data signals to recording signals and outputs the recording signals to the laser power control portion 160.

Based on the servo information received from the signal processing circuit 140, the servo system control portion 150 controls the rotation of the optical disk 110 and the laser light irradiation position. For example, the servo system control portion 150 can adjust the laser light focus based on servo information expressing focusing tolerance, or can inhibit laser light tracking errors based on servo information expressing tracking tolerance.

The front monitor 200 possesses the functions of a photodetection device, where laser light is input via the beam splitter 134, the strength of the laser light is converted into electrical signals and the signals output to the laser power control portion 160. Based on the electrical signals received from the front monitor 200, the laser power control portion 160 generates laser control signals to control the strength of the laser light irradiated by the laser aperture 132 and outputs the signals to the laser driver portion 130. In other words, by feeding back the laser light irradiated by the laser aperture 132 via the front monitor 200, the strength of the laser light can be controlled using the laser power control portion 160.

In response to the input laser light, the front monitor 200 according to the present embodiment can generate and output electrical signals with excellent characteristics. A detailed explanation follows of the front monitor 200 according to the present embodiment that realizes these functions.

Figure 2:
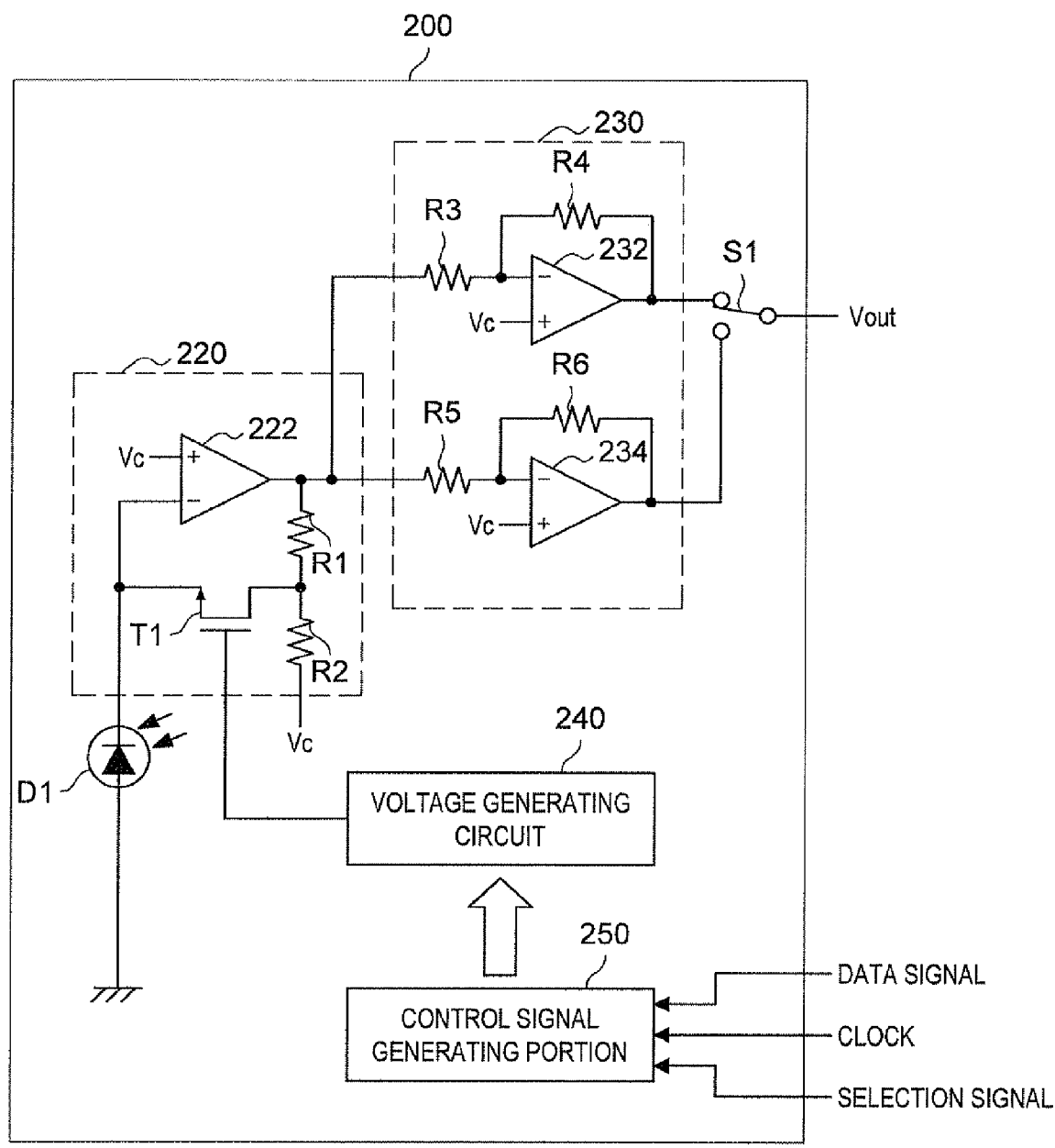
FIG. 2 is an explanatory diagram showing the structure of a front monitor circuit according to the first embodiment.

FIG. 2 is an explanatory diagram showing the structure of the front monitor 200 circuit. The front monitor 200 (or laser power monitor IC, or front monitor IC) includes a photodiode D1, an electrical current/voltage converter portion 220, a voltage amplifier portion 230, a voltage generating circuit 240 and a control signal generating portion 250.

The photodiode D1 detects laser light irradiated from the beam splitter 134 and functions as a photoelectric converter portion, generating an electrical current that corresponds to the strength of the laser light. The photodiode D1 may be a p-n photodiode, where the semi-conductor is formed of a p-layer and an n-layer.

The electrical current/voltage converter portion 220 provides an operational amplifier 222, a MOS transistor T1 and resistive elements R1 and R2, and functions as an electrical current/voltage converter that converts the electrical current generated by the photodiode D1 into voltage.

In the operational amplifier 222 the positive terminal is connected to a reference voltage Vc, and the negative terminal is connected to the photodiode D1 and the operational amplifier 222 feedback circuit. The feedback circuit returns at least part of the output from the operational amplifier 222 to the negative or the positive terminal input side, and may be a part of the circuit that includes the MOS transistor T1 and the resistive element R1 and so on, as shown in FIG. 2.

The MOS transistor T1 and the resistive elements R1 and R2 are included in the operational amplifier 222 feedback circuit, and the electrical current/voltage converter portion 220 converts the electrical current generated by the photodiode D1 into a voltage that corresponds with the resistance values of the MOS transistor T1 and resistive elements R1 and R2, respectively. A key feature of the structure of the feedback circuit according to the present embodiment is that the MOS transistor T1 is included as a first MOS transistor. The reason for including the MOS transistor T1 in the feedback circuit is explained in more detail later, with reference to FIG. 3.

The voltage amplifier portion 230 provides an operational amplifier 232, which is a first amplifier portion that includes resistive elements R3 and R4, and an operational amplifier 234, which is a second amplifier that includes resistive elements R5 and R6.

In the first amplifier, one terminal of the resistive element R3 is connected to the output side of the electrical current/voltage converter portion 220, while the other terminal is connected to the negative terminal of the operational amplifier 232 and one terminal of the resistive element R4. The other terminal of the resistive element R4 is connected to the output terminal of the operational amplifier 232, and the positive terminal of the operational amplifier 232 is connected to the reference voltage Vc. This first amplifier can amplify the voltage input from the electrical current/voltage converter portion 220 based on the ratio of the resistive elements R3 and R4.

In the second amplifier, one terminal of the resistive element R5 is connected to the output side of the electrical current/voltage converter portion 220, while the other terminal is connected to the negative terminal of the operational amplifier 234 and one terminal of the resistive element R. The other terminal of the resistive element R6 is connected to the output terminal of the operational amplifier 234, and the positive terminal of the operational amplifier 234 is connected to the reference voltage Vc. This second amplifier can amplify the voltage input from the electrical current/voltage converter portion 220 based on the ratio of the resistive elements R5 and R6.

The voltage amplifier portion 230 includes multiple amplifiers as described above because it is necessary for the single front monitor 200 to control multiple laser lights. In other words, when setting multiple laser lights to different powers, the first amplifier and second amplifier are provided to widen the range of power settings for each laser light. It is possible to select which amplifier to activate using switch S1.

The voltage generating circuit 240 generates voltage based on control signals generated by the control signal generating portion 250, and the generated voltage is applied to the MOS transistor T1 gate. A detailed explanation of the structure of the voltage generating circuit 240 with reference to FIG. 4 and FIG. 5 will follow later.

Based on data signals received externally, and in accordance with a clock and a selection signal, the control signal generating portion 250 functions as the control portion, generating control signals to control the voltage generating circuit 240. For example, the control signal generating portion 250 generates control signals by receiving the value of the trailing edge clock data signal during periods in which the incoming selection signal is high, and by not receiving the data signal during periods in which the incoming selection signal is low. In the present embodiment, a high selection signal can be input during periods in which the value of the voltage generated by the voltage generating portion 240 is being adjusted, and a low selection signal can be input during periods in which the value of the voltage generated by the voltage generating portion 240 is fixed.

The structure of the front monitor 200 according to the present embodiment has been explained above. With the front monitor 200 described above, it is necessary to adjust gain at the time of manufacture so that the front monitor gives a specific output in relation to the irradiated light. For this purpose, for example, the variable resistors 82 and 84 have been used, as shown in FIG. 7. However, in the example shown in FIG. 7, as the variable resistors 82 and 84 are provided externally to the front monitor 70, when the front monitor 70 inputs and outputs electrical signals between the variable resistors 82 and 84, parasitic capacitance and parasitic impedance in the circuit have a negative impact on the frequency characteristics and pulse response characteristics.

A key focus of the design of the front monitor 200 according to the present embodiment has been to overcome the above-mentioned problem. By providing the MOS transistor T1 in the feedback circuit of the electrical current/voltage converter portion 220, it is possible to clearly improve the electrical characteristics of the front monitor 200 according to the present embodiment. A detailed explanation follows of the electrical current/voltage converter portion 220, which is one of the key features of the front monitor 200 structure.

The value of the trans impedance, which acts as the electrical current/voltage converter portion 220 gain, is determined by the resistance values of the MOS transistor T1 and the resistive elements R1 and R2. Quantitatively, the electrical current/voltage converter portion 220 trans impedance can be shown by Formula 1. Note that the trans impedance of the converter portion 80 shown in FIG. 7 is the resistance value of the resistive element Rf.

[Formula 1]

$$RT = Ron \times \left(1 + \frac{R1}{R2}\right) \quad \text{(Formula 1)}$$

In Formula 1, RT is trans impedance, and Ron is the MOS transistor T1 on-resistance. The on-resistance is the resistance between the MOS transistor T1 source and drain. The resistance of the resistive element R2 may be significantly lower than the on-resistance of the MOS transistor T1.

With reference to Formula 1, it can be seen that the value of the trans impedance, namely the gain of the electrical current/voltage converter portion 220, corresponds to the on-resistance of the MOS transistor T1. Here, the value of the MOS transistor T1 on-resistance corresponds to the MOS transistor T1 gate voltage. Therefore, by adjusting the MOS transistor T1 gate voltage, it is possible to adjust the electrical current/voltage converter portion 220 gain and also adjust the front monitor 200 output.

In this way, by providing a MOS transistor T1 in the feedback circuit of the electrical current/voltage converter portion 220, the variable resistors 82 and 84 shown in FIG. 7 are no longer required, allowing reductions in production costs. Further, as the front monitor 200 gain adjustment function can be built into the front monitor 200, parasitic capacitance and parasitic impedance are minimized, allowing improvements in the electrical characteristics of the front monitor 200, such as the frequency characteristics and pulse response characteristics.

Further, the example shown in FIG. 7 uses two variable resistors, but if variable resistors are used to adjust gain, in line with the spread of next-generation disks, it is necessary to provide more variable resistors separately. However, the optical pick up mounting surface is limited, and it has proven difficult to mount a great number of variable resistors on the optical pick up. As the front monitor 200 according to the present embodiment does not require the variable resistors to be provided externally to the front monitor 200, an added advantage is the increased degree of freedom in the design of the optical pick up and the optical disk device.

Here, the resistive elements R1 and R2 in the electrical current/voltage converter portion 220 increase the MOS transistor T1 drain voltage and contribute to the gain of the electrical current/voltage converter portion 220, and they are provided to suppress the voltage Vds occurring between the source and the drain of the MOS transistor T1. If the resistive elements R1 and R2 were not provided, in order to obtain a specified voltage for the electrical current/voltage converter portion 220, it would be necessary to increase the MOS transistor T1 on-resistance and the voltage Vds. However, the MOS transistor T1 on-resistance can only be regarded as equivalent to the resistive elements when the voltage Vds is extremely small, as shown in FIG. 3.

Figure 3:
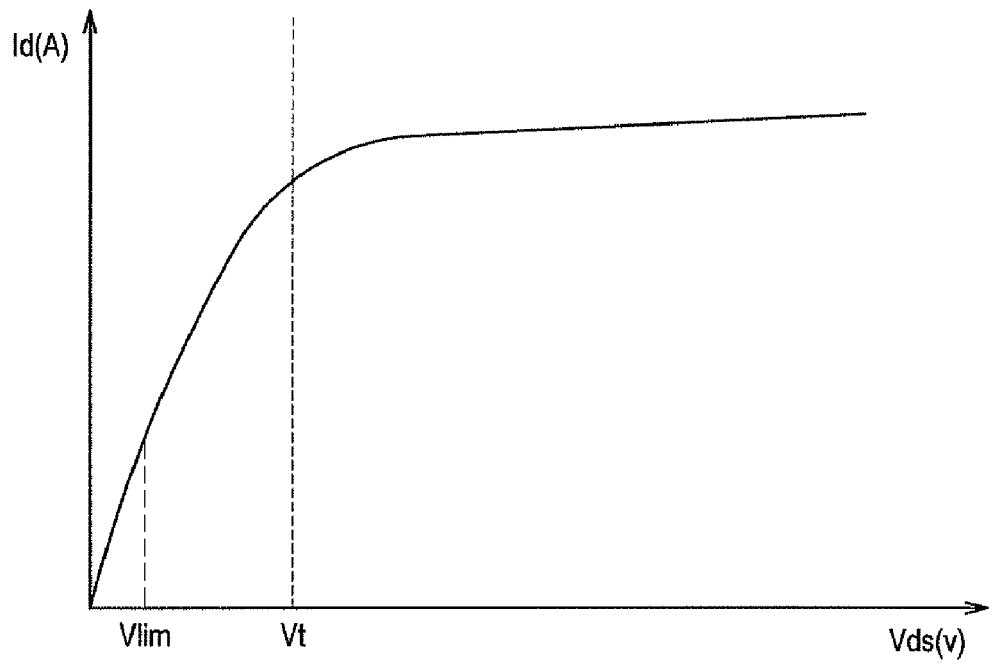
FIG. 3 is an explanatory diagram showing the electrical characteristics of a MOS transistor.

FIG. 3 is an explanatory diagram showing the electrical characteristics of the MOS transistor T1. As shown in FIG. 3, if a voltage of Vt or more occurs between the source and the drain of the MOS transistor T1, even if the voltage Vds rises, the drain current Id flowing through the MOS transistor T1 levels off at a maximum value, showing saturation region behavior. The MOS transistor T1 on-resistance is regarded as equivalent to the resistive elements when the voltage Vds occurring between the source and the drain of the MOS transistor T1 is in a nearly proportional relationship to the drain current Id, and therefore the voltage Vds occurring between the source and the drain of the MOS transistor T1 must be equal to or lower than the voltage Vt.

Further, strictly, for the voltage Vds occurring between the source and the drain of the MOS transistor T1 to be in a proportional relationship to the drain current Id, the voltage Vds occurring between the source and the drain of the MOS transistor T1 source must be no higher than the boundary voltage Vlim (deep triode region). Therefore, for the MOS transistor T1 on-resistance to be regarded as equivalent to the resistive elements, it is necessary to suppress the voltage Vds occurring between the source and the drain of the MOS transistor T1.

The resistive elements R1 and R2 suppress the voltage Vds occurring between the source and the drain of the MOS transistor T1 described above, and this structure allows the MOS transistor T1 on-resistance to be regarded as equivalent to the resistive elements. In other words, with reference to Formula 1, when obtaining a stipulated trans impedance, it can be seen that if R1/R2 are set to a large value, the MOS transistor T1 on-resistance can be reduced. With this specific structure including the resistive elements R1 and R2 in the electrical current/voltage converter portion 220, it is possible to realize the front monitor 200 according to the present embodiment, which offers excellent electrical characteristics.

FIG. 2 merely shows a single example of the resistive elements R1 and R2 provided in the feedback circuit, and the layout of the resistive elements is not limited to the given example. For example, resistive element(s) may be provided in the MOS transistor T1 source side and the resistive element R1 shown in FIG. 2 may be omitted.

A detailed explanation has been given above of the structure of the electrical current/voltage converter portion 220. Next, an explanation will be given of the specific structure of the voltage generating portion 240, with reference to FIG. 4 and FIG. 5.

Figure 4:
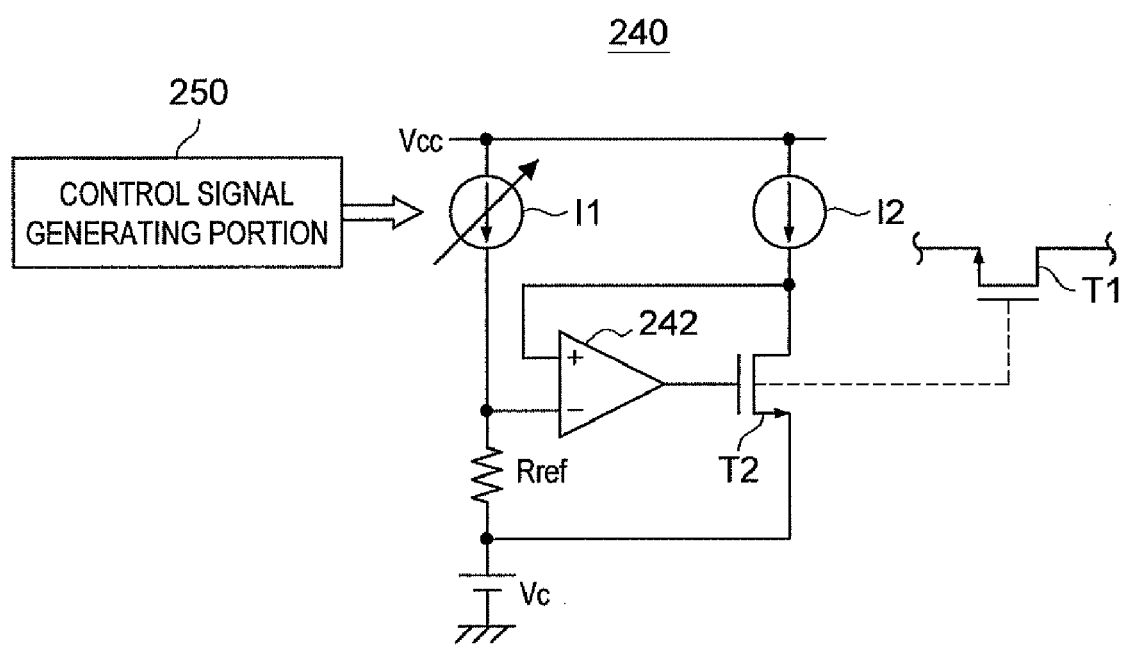
FIG. 4 is an explanatory diagram showing an example of the structure of a voltage generating circuit.
Figure 5:
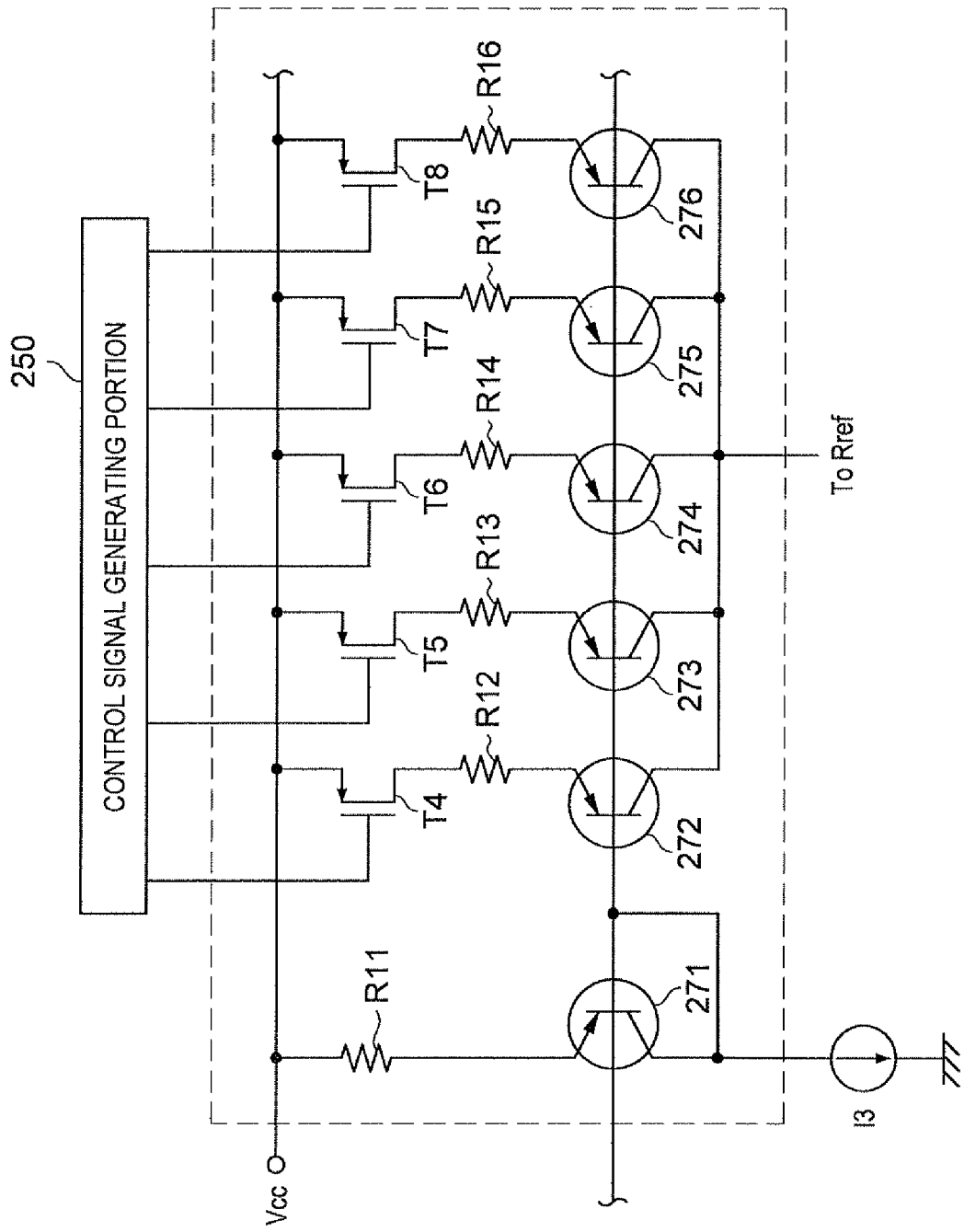
FIG. 5 is an explanatory diagram showing an example of the structure of a variable-current source that forms a voltage generating circuit.

FIG. 4 is an explanatory diagram showing an example of the structure of the voltage generating circuit 240. FIG. 5 is an explanatory diagram showing an example of the structure of a variable electric current source I1 that forms the voltage generating circuit 240. With reference to FIG. 4, the voltage generating portion 240 includes the variable-current source I1, a reference resistance Rref, an electrical current source I2, an operational amplifier 242 and a second MOS transistor T2.

One terminal of the variable electrical current source I1 is connected to a first voltage Vcc, while the other terminal is connected to the negative terminal of the operational amplifier 242 and one terminal of the reference resistance Rref. By adjusting the current supplied by the variable-current source, it is possible to adjust the voltage generated by the voltage generating circuit 240. A detailed explanation will later be given with reference to FIG. 5.

One terminal of the reference resistance Rref is connected to the variable-current source I1, and the other terminal is connected to the reference voltage Vc and to the MOS transistor T2 source (the second terminal). The value of the voltage occurring in the reference resistance Rref is the current supplied by the variable-current source multiplied by the resistance value of the reference resistance Rref.

One terminal of the current source I2 is connected to the first voltage Vcc, and the other terminal is connected to the positive terminal of the operational amplifier 242 and the MOS transistor T2 drain (the first terminal). The current source I2 can provide a specified current.

So that the voltage occurring between the source and the drain of the MOS transistor T2 agrees with the voltage value occurring in the reference resistance Rref, the operational amplifier 242 applies a voltage to the MOS transistor T2 gate. In other words, the operational amplifier 242 realizes the MOS transistor T2 on-resistance such that the voltage resulting from the current supplied by the variable-current source multiplied by the reference resistance Rref resistance value is equal to the voltage occurring from the current supplied by the current source I2 multiplied by the MOS transistor T2 on-resistance.

The voltage applied to the MOS transistor T2 gate by the operational amplifier 242 is also applied to the MOS transistor T1 gate. Here, as the voltage applied by the operational amplifier 242 to the MOS transistor T2 gate can be adjusted by the current supplied by the variable-current source I1, the MOS transistor T1 gate voltage and the on-resistance can be adjusted by adjusting the electrical current supplied by the variable-current source I1. If the MOS transistor T1 and the MOS transistor T2 have the same design, it is possible to ensure that the MOS transistor T1 on-resistance and the MOS transistor T2 on-resistance are in accordance with each other.

With reference to FIG. 5, the variable-current source I1 includes resistive elements R11 to R16, MOS transistors T4 to T8 and transistors 271 to 276.

The emitter of the transistor 271 is connected to one terminal of the resistive element R11, while the base and the collector are diode-connected. The transistor 271 collector is connected to a current source I3 that is generated by the front monitor 200 by a selected method, and the other terminal of the resistive element R11 is connected to the first voltage Vcc. The transistor 271 outputs a collector current that corresponds to the resistance value of the resistive element R11. As a result, a voltage that corresponds to the resistance value of the resistive element R11 is applied to the transistor 271 base. As the voltage that corresponds to the resistance value of the resistive element R11 is also applied to the bases of the transistors 272 to 276, the variable-current source I1 can also be regarded as a current mirror circuit.

The source of the MOS transistor T4 is connected to the first voltage Vcc, the gate is connected to the control signal generating portion 250, and the drain is connected to one terminal of the resistive element R12. The other terminal of the resistive element R12 is connected to the transistor 272 emitter. The base of the transistor 272 is connected to the base of the transistor 271 and the transistor 272 collector is connected to the reference resistance Rref.

In the transistor 272, if the on-voltage that causes current to flow from the source to the drain of the MOS transistor T4 is applied to the MOS transistor T4 gate by the control signal generating portion 250, an electrical current that corresponds with the ratio of the resistance values of the resistive element R12 and the resistive element R11 is output as the collector current.

The source of the MOS transistor T5 is connected to the first voltage Vcc, the gate is connected to the control signal generating portion 250, and the drain is connected to one terminal of the resistive element R13. The other terminal of the resistive element R13 is connected to the transistor 273 emitter. The base of the transistor 273 is connected to the base of the transistor 271 and the transistor 273 collector is connected to the reference resistance Rref.

In the transistor 273, if the on-voltage that causes current to flow from the source to the drain of the MOS transistor T5 is applied to the MOS transistor T5 gate by the control signal generating portion 250, an electrical current that corresponds with the ratio of the resistance values of the resistive element R13 and the resistive element R11 is output as the collector current.

The source of the MOS transistor T6 is connected to the first voltage Vcc, the gate is connected to the control signal generating portion 250, and the drain is connected to one terminal of the resistive element R14. The other terminal of the resistive element R14 is connected to the transistor 274 emitter. The base of the transistor 274 is connected to the base of the transistor 271 and the transistor 274 collector is connected to the reference resistance Rref.

In the transistor 274, if the on-voltage that causes current to flow from the source to the drain of the MOS transistor T6 is applied to the MOS transistor T6 gate by the control signal generating portion 250, an electrical current that corresponds with the ratio of the resistance values of the resistive element R14 and the resistive element R11 is output as the collector current.

The source of the MOS transistor T7 is connected to the first voltage Vcc, the gate is connected to the control signal generating portion 250, and the drain is connected to one terminal of the resistive element R15. The other terminal of the resistive element R15 is connected to the transistor 275 emitter. The base of the transistor 275 is connected to the base of the transistor 271 and the transistor 275 collector is connected to the reference resistance Rref.

In the transistor 275, if the on-voltage that causes current to flow from the source to the drain of the MOS transistor T7 is applied to the MOS transistor T7 gate by the control signal generating portion 250, an electrical current that corresponds with the ratio of the resistance values of the resistive element R15 and the resistive element R11 is output as the collector current.

The source of the MOS transistor T8 is connected to the first voltage Vcc, the gate is connected to the control signal generating portion 250, and the drain is connected to one terminal of the resistive element R16. The other terminal of the resistive element R16 is connected to the transistor 276 emitter. The base of the transistor 276 is connected to the base of the transistor 271 and the transistor 276 collector is connected to the reference resistance Rref.

In the transistor 276, if the on-voltage that causes current to flow from the source to the drain of the MOS transistor T8 is applied to the MOS transistor T8 gate by the control signal generating portion 250, an electrical current that corresponds with the ratio of the resistance values of the resistive element R16 and the resistive element R11 is output as the collector current.

Here, the current output by the variable-current source I1 is equivalent to the sum total of the collector current output by the above-mentioned transistors 272 to 276. Therefore, depending on whether or not the control signal generating portion 250 applies on-voltage to the gates of the MOS transistors T4 to T8, the presence or lack of collector current from the transistors 272 to 276 can be controlled, and the amount of the current output by the variable-current source I1 can be adjusted.

On-voltage may be constantly applied to the MOS transistor T8. The resistance values of the resistive elements R12 to R15 may be set such that the amount of the current output by transistors 272 to 275 is 1:2:4:8.

An example of the structure of the variable-current source I1 has been given above, but the variable-current source I1 is not limited to the example shown in FIG. 5, and any desired structure may be used as the variable-current source I1 where the output amount of the current is variable. For example, the MOS transistors, resistive elements and transistors (bipolar) set up as part of the variable-current source I1 need not be limited to 5 sets, but could be provided in a greater number to realize a multi-bit current generated by the variable-current source I1. Next, an explanation will be given of the electrical characteristics of the front monitor 200 according to the present embodiment, with reference to FIG. 6.

Figure 6A:
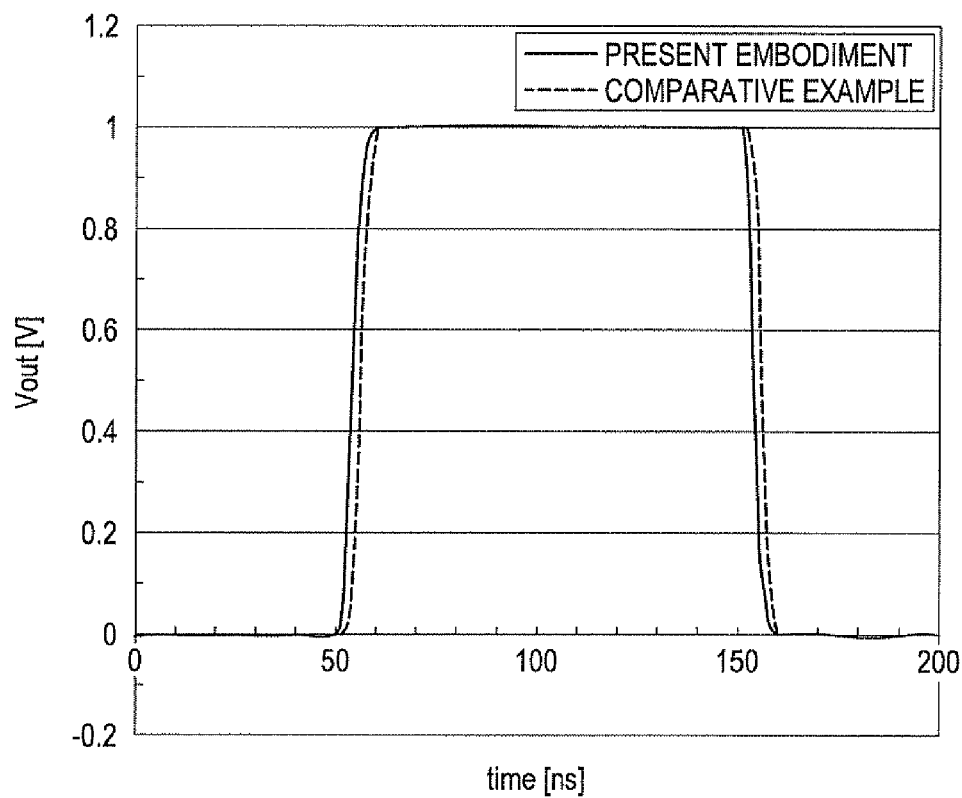
FIG. 6 is an explanatory diagram showing the electrical characteristics of the front monitor according to the first embodiment.
Figure 6B:
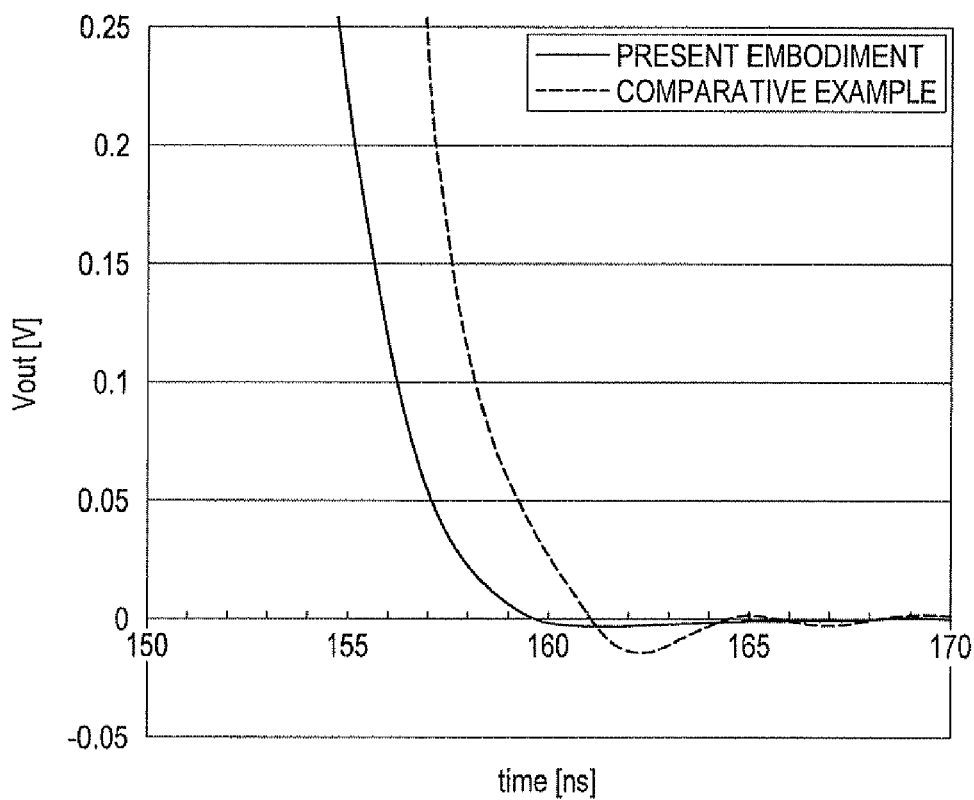

FIG. 6 is an explanatory diagram showing the electrical characteristics of the front monitor 200 according to the present embodiment. Specifically, FIG. 6A shows the front monitor 200 output when the light is blocked after light is irradiated into the front monitor 200. FIG. 6B is an enlargement of a section of FIG. 6B. A simulation of the characteristics of the front monitor 200 according to the present embodiment is shown by the solid lines, and the characteristics of a comparative front monitor 70 shown in FIG. 7 are shown by the dotted lines. The horizontal axis shows time, and the vertical axis shows output.

With reference to FIG. 6A, when the front monitor 200 according to the present embodiment is compared to the front monitor 70, it can be seen that the response speed of the front monitor 200 is faster. A faster operating speed is demanded by next-generation disks, and the response speed when light is irradiated or is blocked is therefore a key factor. Thus, the enhanced response speed offered by the front monitor 200 according to the present embodiment is advantageous.

With reference to FIG. 6B, it can be seen that ringing occurs in the front monitor 70. Specifically, the front monitor 70 output during the pulse response falls excessively over 161 to 164 ns. The front monitor 70 output continues to be unstable, becoming stable around 170 ns. This ringing phenomenon occurs as a result of the parasitic impedance and parasitic capacitance caused by the resistive elements 82 and 84 provided externally to the front monitor 70.

As parasitic impedance and parasitic capacitance are minimized by the front monitor 200 according to the present embodiment, ringing does not occur in the front monitor 200 and an excellent pulse response output can be achieved.

As explained above, by providing the MOS transistor T1 in the electrical current/voltage converter portion 220 feedback circuit, the front monitor 200 according to the present embodiment can cause the MOS transistor T1 to function as a gain adjuster. Therefore, the front monitor 200 does not require externally provided resistive elements for the adjustment of gain, allowing reductions in production costs. Further, as the front monitor 200 gain adjuster function can be incorporated into the front monitor 200, parasitic capacitance and parasitic impedance, which have an effect on output, can be minimized, thus improving the electrical characteristics of the front monitor 200, such as frequency characteristics and pulse response characteristics.

In the front monitor 200 according to the present embodiment, as the feedback circuit of the electrical current/voltage converter portion 220 includes the resistive elements R1 and R2 that contribute to the gain of the electrical current/voltage converter portion 220, the voltage occurring in the feedback circuit is distributed between the MOS or transistors and the resistive elements. Here, the MOS transistor T1 on-resistance can only be regarded as equivalent to the resistive elements when the voltage occurring in the first MOS transistor is at a certain voltage or lower. Therefore, the resistive elements R1 and R2 are provided in the feedback circuit to suppress the voltage occurring in the MOS transistor T1, to allow the MOS transistor T1 on-resistance to be regarded as equivalent to the resistive elements.

It should be understood by those skilled in the art that various modifications, combinations, sub-combinations and alterations may occur depending on design requirements and other factors insofar as they are within the scope of the appended claims or the equivalents thereof.

The example used in the explanation of the above-described embodiment is of the front monitor when used in an optical disk device, but the applications for the front monitor are not limited to this application, and the front monitor can be used freely as desired in sensors or for control purposes.

In the above-described embodiment, the explanation describes an example where the MOS transistor T1 is an n-type transistor, but the MOS transistor T1 may be a p-type transistor. In the same way, in the example the transistors 271 to 276 that form the variable-current source I1 are p-n-p transistors, but n-p-n transistors may alternatively be used.

What is claimed is:

1. A photodetection device comprising:
a photoelectric converter portion that converts light to an electric current;
an electrical current/voltage converter portion that includes a feedback circuit that returns at least part of an output to an input side, that converts the electrical current received from the photoelectric converter portion to a voltage corresponding to a resistance value of the feedback circuit and that outputs a voltage;
a control portion that generates control signals to control the gate voltage of a first MOS transistor; and
a voltage generating portion that generates a voltage based on the control signals generated by the control portion, and applies the generated voltage to a gate of the first MOS transistor,
wherein,
the feedback circuit includes the first MOS transistor to allow the resistance value to be varied in accordance with a gate voltage,
the voltage generating portion includes (a) a reference resistor that generates a voltage corresponding to a current supplied by a variable-current source, (b) a second MOS transistor in which a first terminal is connected to a fixed current and in which a second terminal is connected to the reference resistor, and (c) a gate voltage generating portion that generates a voltage such that a voltage arising between the first and the second terminals of the second MOS transistor is equivalent to the voltage generated by the reference resistor, and
the second MOS transistor gate voltage generated by the gate voltage generating portion is applied to the first MOS transistor gate.

2. The photodetection device according to claim 1, wherein the feedback circuit includes resistive elements that contribute to the gain of the electrical current/voltage converter portion.

3. An optical disk device comprising:
a laser irradiating portion that irradiates laser light onto an optical disk;
a photodetection portion that detects at least part of the laser light irradiated by the laser irradiating portion as electrical signals; and
a laser power control portion that controls the strength of the laser light irradiated by the laser irradiating portion based on the laser light detected as electrical signals by the photodetection portion,
wherein,
the photodetection portion includes (a) control portion that generates control signals to control the gate voltage of the first MOS transistor, (b) a voltage generating portion that generates a voltage based on the control signals generated by the control portion, and applies the generated voltage to a gate of the first MOS transistor, (c) a photoelectric converter portion that converts at least part of the laser light irradiated by the laser irradiating portion into electrical current, and (d) an electrical current/voltage converter portion that includes a feedback circuit that returns at least part of an output to an input side, that converts the electrical current received from the photoelectric converter portion to a voltage corresponding to a resistance value of the feedback circuit, and outputs a voltage, the feedback circuit including a first MOS transistor that allows the resistance to be varied in accordance with a gate voltage, the voltage generating portion includes (a) a reference resistor that generates a voltage corresponding to a current supplied by a variable-current source, (b) a second MOS transistor in which a first terminal is connected to a fixed current and in which a second terminal is connected to the reference resistor, and (c) a gate voltage generating portion that generates a voltage such that a voltage arising between the first and the second terminals of the second MOS transistor is equivalent to the voltage generated by the reference resistor, and the second MOS transistor gate voltage generated by the gate voltage generating portion is applied to the first MOS transistor gate.

* * * * *